(12) United States Patent
Ten Pierick et al.

(10) Patent No.: US 6,348,819 B1
(45) Date of Patent: Feb. 19, 2002

(54) DRIVING CIRCUIT FOR A SEMICONDUCTOR SWITCHING ELEMENT

(75) Inventors: Hendrik Ten Pierick; Dirk J. A. Teuling, both of Eindhoven (NL); Friedrich Hahn, Schenefeld (DE); Gianlorenzo Paoletti, Caronno Pertusella (IT)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/497,003

(22) Filed: Feb. 2, 2000

(30) Foreign Application Priority Data

Feb. 5, 1999 (EP) .............................................. 99200348

(51) Int. Cl.[7] .............................. H03B 1/00; H03K 3/00
(52) U.S. Cl. ......................... 327/110; 327/108; 327/377
(58) Field of Search .................................. 327/108, 110, 327/478, 487, 485, 432, 375, 574, 579, 172, 175, 176, 374, 376, 377, 109, 111; 307/60, 116, 126, 130, 131

(56) References Cited

U.S. PATENT DOCUMENTS

| | | | | |
|---|---|---|---|---|
| 4,055,794 A | * | 10/1977 | Ickes et al. ................. | 327/579 |
| 4,158,785 A | * | 6/1979 | Desaintfuscien ............ | 327/172 |
| 4,566,060 A | * | 1/1986 | Hoeksma ..................... | 363/21 |
| 4,751,403 A | * | 6/1988 | Maekawa et al. ........... | 327/375 |
| 5,019,955 A | * | 5/1991 | Hoeksma ..................... | 327/375 |
| 5,107,190 A | | 4/1992 | Schultz et al. .............. | 315/387 |
| 5,397,914 A | * | 3/1995 | Suda et al. .................. | 327/110 |
| 5,412,332 A | * | 5/1995 | Heeringa et al. ............ | 327/110 |
| 5,486,787 A | * | 1/1996 | Maekawa et al. ........... | 327/108 |
| 6,046,623 A | * | 4/2000 | Hasegawa ................... | 327/478 |

FOREIGN PATENT DOCUMENTS

| | | |
|---|---|---|
| DE | 3518768 A1 | 11/1986 |
| EP | 0115037 A2 | 8/1984 |
| EP | 0163302 A2 | 12/1985 |
| EP | 0324486 A2 | 7/1989 |
| EP | 0387961 A1 | 9/1990 |

* cited by examiner

*Primary Examiner*—Terry D. Cunningham
*Assistant Examiner*—Long Nguyen

(57) ABSTRACT

In a driving circuit (2,3) for a semiconductor switching element (1), a storage time (Ts) of the semiconductor switching element (1) is measured (2) to control the semiconductor switching element (1) such that the storage time (Ts) is kept substantially constant.

17 Claims, 3 Drawing Sheets

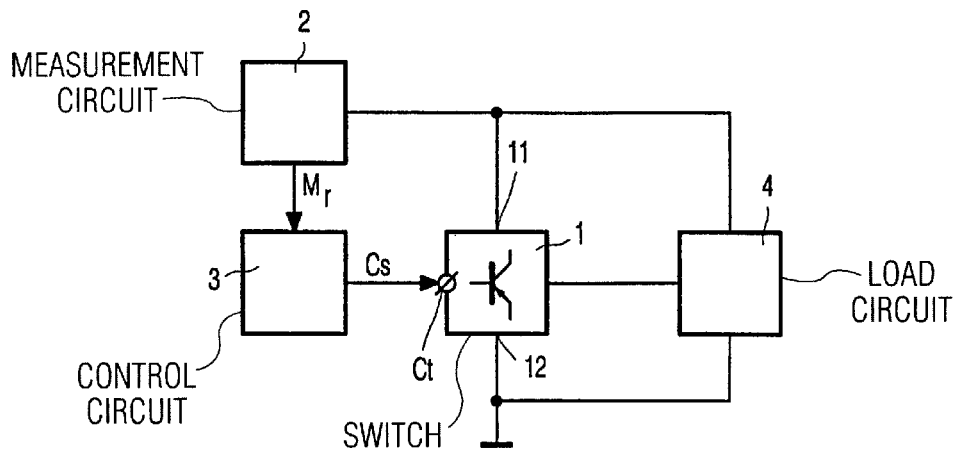
FIG. 1
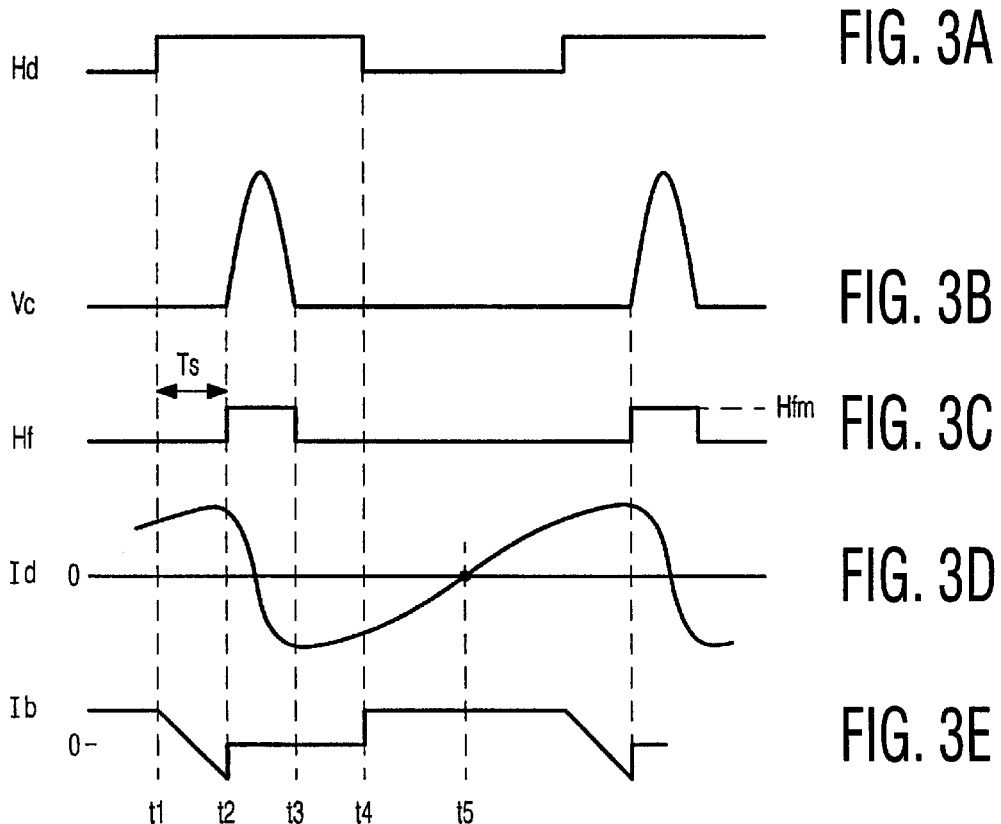
FIG. 3A
FIG. 3B
FIG. 3C
FIG. 3D
FIG. 3E

DRIVING CIRCUIT FOR A SEMICONDUCTOR SWITCHING ELEMENT

BACKGROUND OF THE INVENTION

The invention relates to a circuit for driving a switching transistor which has a control terminal and a main current path, and during a switch-off phase (that is, in response to reversal of control terminal current to switch the transistor off) has a storage time delay between the control current reversal and the start of switching off of the main current path. The invention also relates to a method of driving such a switching transistor. The invention further relates to a line deflection circuit with such a driving circuit and a switched mode power supply with such a driving circuit.

DE-A-3518768 discloses a drive circuit for a switching transistor used in a switched mode power supply or a line deflection circuit. In a first period, the drive circuit supplies a base current to the switching transistor with a polarity such that the switching transistor conducts. In a second period, the drive circuit supplies a base current with an opposite polarity to switch off the switching transistor. It takes some time (usually referred to as the storage time) from the start of the second period before the accumulated charge in the switching transistor has been removed and the switching transistor starts switching off its main current path. With respect to the line deflection circuit wherein the switching transistor is a bipolar transistor, next, during the flyback period, a resonant circuit coupled to the collector of the switching transistor starts resonating thereby causing at the collector a flyback pulse with a half sinewave shape. During the first part of the flyback period, the voltage across the switching transistor main path increases while the current through the main path decreases rapidly to zero. The power dissipated in the switching transistor during this transition period wherein both a finite current and voltage occur, is further referred to as flyback losses. In DE-A-3518768 the base current of the switching transistor is controlled in response to the steepness of the flyback pulse to keep the flyback losses during the flyback period substantially constant. The dimensioning of the circuit is cumbersome because the base current has to be adjusted to a desired value in a situation wherein both the switching transistor has been selected with properties causing a maximal base current and the drive circuit has been dimensioned to cause a maximal base current. It is a further drawback of the prior art that extra components are required to determine the steepness of the flyback pulse.

BRIEF SUMMARY OF THE INVENTION

It is, inter alia, an object of the invention to provide an optimal drive of a switching transistor without the need to know all the spreads of the drive circuit and the switching transistor.

To this end, a first aspect of the invention provides a circuit for driving a switching transistor. A second aspect of the invention provides a method of driving a switching transistor. A third aspect of the invention provides a line deflection circuit with such a driving circuit. A fourth aspect of the invention provides a switched mode power supply with such a driving circuit. Advantageous embodiments are defined in the dependent claims.

According to the first aspect of the invention, the storage time of the semiconductor switching element (the switching transistor) is measured to control the control signal supplied to the control terminal of the semiconductor switching element in a manner enabling the storage time to be kept substantially constant. The semiconductor switching element may be any suitable single switching element or a combination of switching elements. For example, the switching element is a bipolar transistor, a field effect transistor, a gate turn off device (GTO), or an insulated gate bipolar transistor (IGBT). Examples of the combination of switching elements are darlington arrangements, series or parallel arrangements. All these switching elements have in common that they show a delay (the storage time) between the instant that the control signal indicates, to the control electrode (the base or gate), that the switching element should be switched off and the instant the main path (collector-emitter, drain-source) starts switching off.

EP-A-0163302 discloses a driver circuit for a line deflection power transistor. The driver circuit controls the base current of the transistor in dependence on the current through the main path of the transistor to lower the dissipation in the transistor. To be compatible with existing phi2 controllers, it is an essential feature of this prior art that the base current is controlled in such a way that the storage time variation is inversely proportional to the end value of the collector current of the transistor.

In an embodiment of the invention in accordance with claim 3, the storage time is measured by using a counter which counts clock pulses from at the instant the switching transistor receives the command to switch off until the instant the main path starts switching off. This way of measuring the storage time is especially easy and cheap when the driver circuit comprises digital circuits or a microprocessor, which is becoming more and more the case in synchronization circuits in display apparatuses. In this case, a very flexible solution is available: during production, the desired storage time can be programmed into the synchronization circuit via a bus. The desired storage time may depend on the type of switching element used, or on the application of this switching element. DE-A-3518768 measures the steepness of the flyback pulse, which is more complicated and less flexible than measuring the storage time and controlling the storage time.

In an embodiment of the invention in accordance with claim 4, the storage time is controlled by varying the amount of current in the control electrode of the switching element.

In an embodiment of the invention in accordance with claim 5, the storage time is controlled by varying the duty cycle of the control signal supplied to the control electrode. It is also possible to vary the slope of the current in the control electrode to control the storage time.

These and other aspects of the invention will be apparent from and elucidated with reference to the embodiments described hereinafter.

BRIEF DESCRIPTION OF THE SEVERAL VIEWS OF THE DRAWING

In the drawings:

FIG. 1 shows a block diagram of a driving circuit controlling a switching element according to the invention, FIGS. 3 shows a waveforms for explaining the operation of the circuit according to FIG. 2.

DETAILED DESCRIPTION OF THE INVENTION

Figure 2:
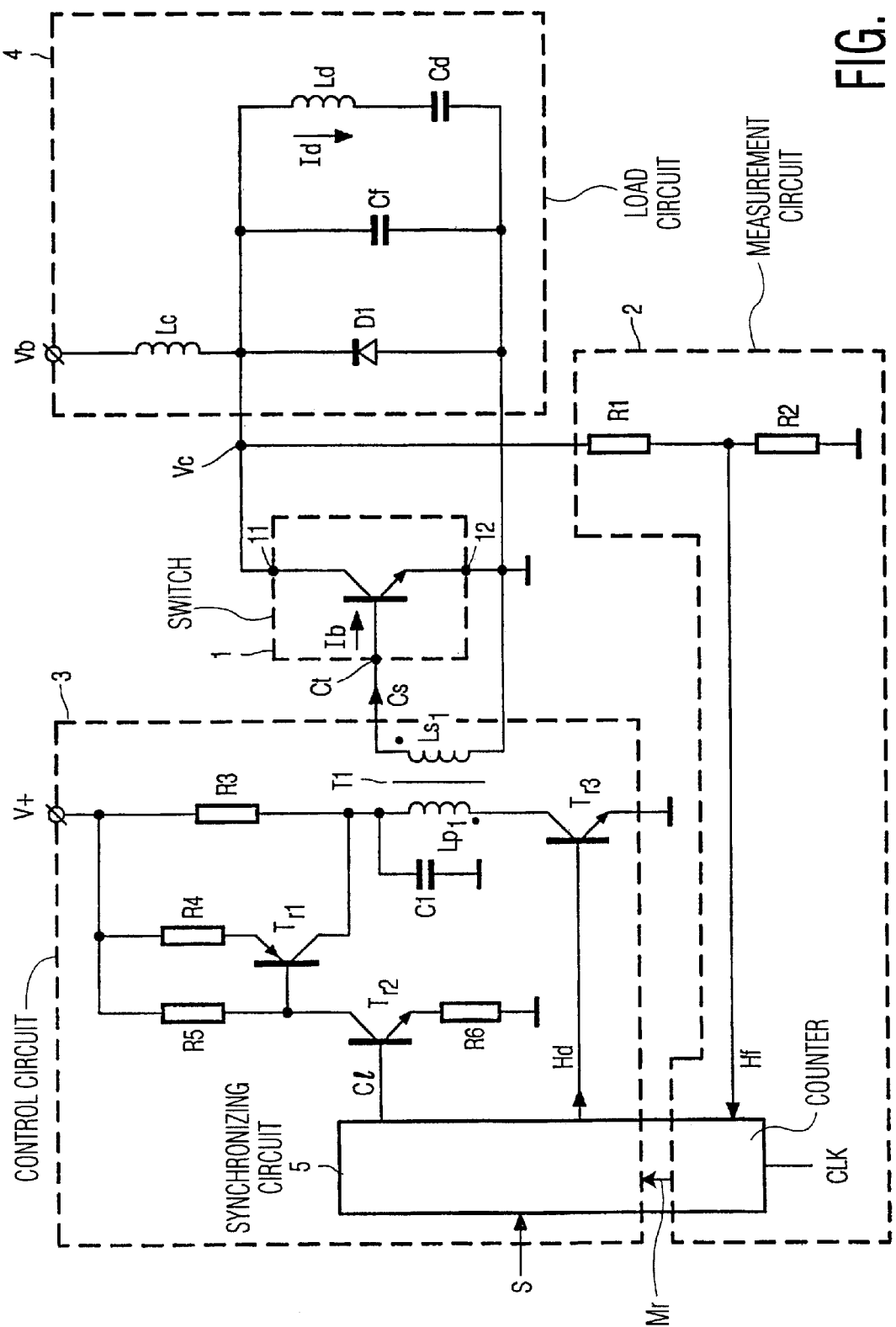
FIG. 2 shows a circuit diagram of a line deflection circuit with a switching element controlled by a driving circuit according to an embodiment of the invention.

FIG. 1 shows a block diagram of a driving circuit controlling a semiconductor switching element according to the invention. The semiconductor switching element 1 (further referred to as switch) has a main path 11, 12 which is conducting or non-conducting dependent on the control signal Cs supplied to the control terminal Ct of the switch 1. The main path 11, 12 of the switch 1 is coupled to a load circuit 4. The load circuit 4 may be a line deflection circuit, a switched mode power supply, or any other circuit in which large currents have to be switched on and off, and in which a large voltage occurs across the main path 11, 12 after the switch 1 has been switched off. The invention is particularly important in applications wherein the switch needs to be constructed so as to withstand such a high voltage during its off period, and such a high current during its on period that a significant storage time Ts occurs during a switch-off period of the switch 1. For example, in line deflection circuits, the storage time is typically within a range from 2 to 10 as, which is considered significant.

The behavior of a suitable switch 1 in such an application is elucidated, for example, by means of a bipolar transistor. The base region of the bipolar transistor has to extend between the collector and emitter regions over such a long distance that it is able to withstand the high voltage; furthermore, the areas of the base, collector and emitter region need to be large enough to withstand the large current. Due to these demands, the cubic measure of the base region is quite large and a high amount of charge is needed in the base region to obtain good saturation behavior of the switch during its on-period to minimize dissipation. When at the start of a switch-off period the polarity of the current in the control electrode Ct is selected so as to remove this charge, it takes some time Ts (further referred to as storage time) before this charge has been removed and the main path 11, 12 is switched off. This may give rise to a large dissipation in the switch during the switch-off period, because the large current is not switched off immediately while the high voltage starts increasing. The dissipation depends on the speed of the variation of the current through and the voltage across the main path 11, 12 during the switch-off period. This speed of variation depends on the shape and value of the control signal Cs. In the case of a bipolar transistor, the control signal is the base current. The slope of the base current and the end value during the switch-off period determine how the charge is removed from the base region.

The driving circuit according to the invention further comprises a measurement circuit 2 which measures the storage time Ts to supply a measurement result Mr to a control circuit 3. The control circuit 3 supplies the control signal Cs to the control terminal Ct of the switch 1. If the measurement result Mr indicates that the storage time Ts is too short, the control circuit 3 adapts the control signal Cs to enlarge the storage time Ts. In case the switch 1 is a bipolar transistor, the base current may be increased to increase the charge in the base during the on-period of the transistor. Consequently, the storage time increases because more charge has to be removed during the switch-off phase. In the same way, if the measurement result Mr indicates that the storage time Ts is too long, the control circuit 3 adapts the control signal Cs to decrease the storage time Ts.

This will become clear, when the operation of an embodiment of the driving circuit as shown in FIG. 2 is elucidated in detail with respect to the waveforms shown in FIGS. 3.

FIG. 2 shows a circuit diagram of a line deflection circuit with a switching element controlled by a driving circuit according to an embodiment of the invention.

The switch 1 comprises a control electrode Ct, a first main electrode 11 and a second main electrode 12. The first main electrode 11 is connected to the load circuit 4 which is a simplified embodiment of a line deflection circuit 4. The second main electrode 12 is connected to ground.

The line deflection circuit 4 comprises a series arrangement of a choke Lc and a flyback capacitor Cf, the series arrangement is connected between a power supply voltage Vb and ground. Both a diode D1 and a series arrangement of a line deflection coil Ld and a S-capacitor Cd are arranged in parallel to the flyback capacitor Cf. The cathode of the diode D1 is connected to the main electrode 11. The operation of the basic line deflection circuit 4 is discussed very briefly with respect to FIGS. 3. When the switch 1 is conducting, a constant voltage occurs across the choke Lc and across the deflection coil Ld causing a sawtooth current in both inductors Lc and Ld. The deflection current Id through the deflection coil Ld becomes S-shaped (see FIG. 3D) due to the parabola voltage across the S-capacitor Cd caused by the almost sawtooth shaped current through it. At the instant t2, the main path 11, 12 of the switch 1 becomes non-conducting, i.e. both the current through the choke Lc and the deflection current Id flow into the flyback capacitor Cf causing a high flyback voltage Vc (see FIG. 3B) at the main terminal 11. The flyback capacitor Cf and the two inductors Lc and Ld start resonating, causing the current in the two inductors Lc and Ld to change sign. Now the currents through the two inductors Lc and Ld start discharging the flyback capacitor Cf and the flyback voltage Vc decreases. The diode D1 starts to conduct at the instant t3 the flyback voltage becomes negative. Now, again a constant voltage occurs across the two inductors Lc and Ld causing a sawtooth current in the choke Lc and an S-corrected sawtooth current Id in the deflection coil Ld (see FIG. 3D).

The measurement circuit 2 comprises a series arrangement of the resistors R1 and R2 connected between the main electrode 11 and ground, and part of a synchronizing circuit 5 which is an integrated circuit. The tap of the two resistors R1, R2 supplies a tapped-in flyback voltage Hf to the synchronizing circuit 5. The synchronizing circuit 5 clips this tapped in flyback voltage Hf to a maximum value Hfm (see FIG. 3C).

The control circuit 3 comprises a npn transistor Tr3 with a base receiving periodical line drive pulses Hd from the synchronizing circuit 5, a collector connected to a primary winding Lp1 of a transformer T1, and an emitter connected to ground. The other end of the primary winding Lp1 is connected to ground via a capacitor C1 and to a power supply voltage V+ via a resistor R3. A secondary winding Ls1 of the transformer T1 is connected between the control terminal Ct and ground. The synchronizing circuit 5 further supplies a controlled DC level Cl to the base of a npn transistor Tr2. The transistor Tr2 has an emitter connected to ground via a resistor R6, and a collector connected to the power supply voltage V+ via a resistor R5. A pnp transistor Tr1 has a base connected to the collector of the transistor Tr2, an emitter connected to the power supply voltage V+ via a resistor R4, and a collector connected to the junction of the capacitor C1 and the resistor R3. The capacitor C1 acts as a buffer to more or less stabilize the voltage on the primary winding Lp1. The resistor R3 supplies the current to the capacitor C1.

The synchronizing circuit 5 receives synchronizing information S of a video signal to generate the line drive pulses Hd determining the horizontal position of the video signal displayed on a display screen of a cathode ray tube. The well known synchronizing circuit 5 comprises a so called ^1-loop and ^2-loop. The ^1-loop which is a phase locked loop generates an internal reference pulse which is locked to the horizontal synchronizing pulses in the synchronizing information S. The ^2-loop adapts this internal reference pulse such that the start of the flyback pulses Vc is not modulated by variations in the storage time Ts. The storage time Ts varies in dependence on the amount of current through the main path 11, 12 and temperature. The amount of current through the main path 11, 12 depends on the load on the anode voltage of the cathode ray tube, if this anode voltage is generated by a secondary winding of the choke Lc. According to the invention, in principle, the ^2-loop is superfluous because the storage time is kept substantially constant. The tapped in flyback voltage Hf is now used to vary the DC level C1 to modulate the base current Ib of the switch 1 to obtain the substantially constant storage time Ts. The detailed operation of the circuit is further elucidated with respect to FIGS. 3.

FIGS. 3 show waveforms for explaining the operation of the circuit according to FIG. 2. FIG. 3A shows the line drive pulses Hd. FIG. 3B shows the flyback pulses Vc as they occur on the main terminal 11. FIG. 3C shows the tapped-in flyback voltage Hf. FIG. 3D shows the line deflection current Id. And FIG. 3E shows the current Ib flowing into the control terminal Ct if the switch 1 is a bipolar transistor.

The transistor Tr3 becomes conducting at the rising edge of the drive pulse Hd at instant t1 causing the current through the primary winding Lp1 to starts increasing. The switch 1 will become non-conducting due to the polarity of the primary winding Lp1 and the secondary winding Ls1, as is indicated by the dots adjacent the windings.

At the falling edge of the drive pulse Hd at instant t4, the transistor Tr3 becomes non-conducting and the switch 1 becomes conducting. Energy stored in the transformer T1 will be supplied as positive base current Ib to the control terminal Ct of the switch 1.

Before instant t1, the switch 1 conducts and the base current Ib flows into the control terminal Ct. At instant t1, the voltage across the secondary winding Ls1 reverses sign, causing the base current Ib to decrease with a desired slope due to the spread inductance of the transformer T1. At instant t2, the charge in the base region of switch 1 has been removed to such an extend that the switch 1 starts switching off, the base current Ib rapidly decreases to zero and the flyback pulse Vc starts rising. The period in time lasting from t1 to t2 is the storage time Ts.

The switch 1 has to be switched on no earlier than the instant t3 at which the flyback pulse Vc ends and no later than instant t5 at which the deflection current Id changes sign and diode D1 stops conducting.

The measurement of the storage time Ts is performed by the measurement circuit 2 which comprises the resistors R1 and R2 and part of the synchronizing circuit 5. Therefore, the synchronizing circuit 5 may comprise a hardware or software counter which counts clock pulses CLK from instant t1 defined by the rising edge of the drive pulse Hd up to instant t2 defined by the rising edge of the tapped-in flyback voltage Hf. It is also possible to measure a time period which is related to the storage time, for example from the rising edge of the drive pulse Hd to the falling edge of the tapped-in flyback voltage Hf, as the width of the flyback pulse occurring from instant t2 to instant t3 is substantially constant. The measured storage time Ts is compared with a desired storage time and the synchronizing circuit 5 supplies a DC-level C1 dependent on the difference between the measured and desired storage time. If the measured storage time Ts is smaller than the desired storage time, a higher DC level C1 is supplied. The transistors Tr1 and Tr2 will supply a larger current to the primary winding Lp1, thereby enlarging the energy in the transformer T1. Consequently, the base current Ib increases, the charge in the base region of the switch 1 increases, and the storage time Ts increases too. In this way, a feedback control mechanism keeps the storage time Ts substantially constant. The DC level C1 may be generated by a digital to analog converter controlled by a suitably programmed computer.

Figure 4:
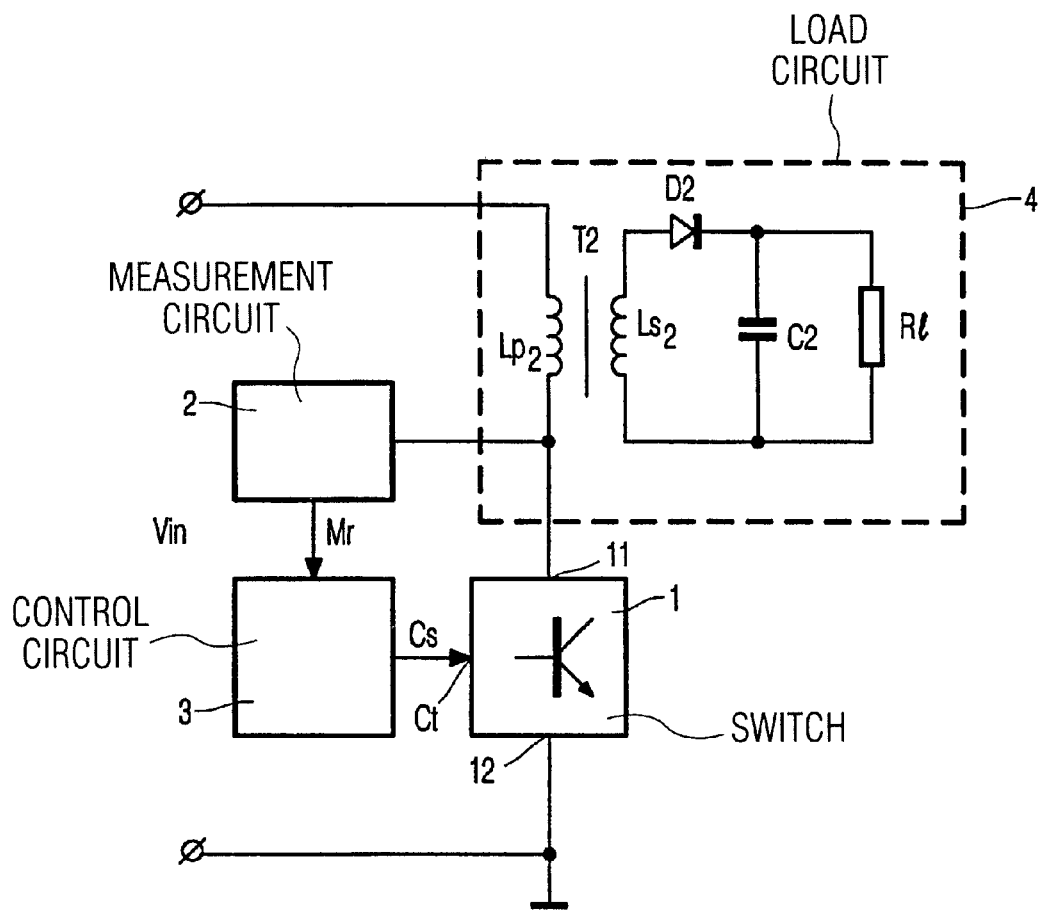
FIG. 4 shows a circuit diagram of a switched mode power supply with a switching element controlled by a driving circuit according to an embodiment of the invention.

FIG. 4 shows a circuit diagram of a switched mode power supply with a switching element controlled by a driving circuit according to an embodiment of the invention. The Switch 1, the measurement circuit 2 and the control circuit 3 have the same function and are referred to with the same references as the corresponding elements in FIG. 1. The switched mode power supply comprises a transformer T2 with a primary winding Lp2 and a secondary winding Ls2. A series arrangement of the primary winding Lp2 and the switch 1 receives an input DC-voltage Vin. The secondary winding Ls2 supplies power to a load R1 via a rectifier element D2. A smoothing capacitor C2 is arranged in parallel with the load R1. The transformer T2 and the components coupled to the secondary winding Ls2 form the load circuit 4. The measurement circuit 2 receives the voltage at the main terminal 11 of the switch 1 to determine the instant the switch 1 starts switching off. The control circuit 3 receives the measurement result Mr from the measurement circuit 2 and supplies the control signal Cs to the control terminal Ct of the switch 1. The measurement circuit 2 and the control circuit 3 may be realized in the same way as elucidated with respect to the circuit of FIG. 2.

It should be noted that the above-mentioned embodiments illustrate rather than limit the invention, and that those skilled in the art will be able to design many alternative embodiments without departing from the scope of the appended claims. The measurement circuit 2 may determine the storage time Ts with analog circuitry, for example by starting a sawtooth signal the instant t1 the control signal Cs indicates that the switch 1 should start switching off. The value of the sawtooth signal at the instant t2 that the switch 1 starts switching off (the current in the main path 11, 12 starts decreasing and the voltage across the main path 11, 12 starts increasing) is a measure of the storage time Ts. Also, the control circuit 3 may comprise analog circuits. A comparator or an operational amplifier compares the value of the sawtooth signal at the instant t2 with a reference value to vary the current in the primary winding Lp1 of the transformer T1 of FIG. 2. The digital to analog converter is then superfluous.

In the claims, any reference signs placed between parentheses shall not be construed as limiting the claim. The word "comprising" does not exclude the presence of elements or steps other than those listed in a claim. The invention can be implemented by means of hardware comprising several distinct elements, and by means of a suitably programmed computer. In the device claim enumerating several means, several of these means can be embodied by one and the same item of hardware.

What is claimed is:

1. A driving circuit for a semiconductor switching element having a control terminal and a main current path, during a switch-off phase said switching element having a storage time between reversal of the control current and the start of switching off of the main current path, the driving circuit comprising:

measurement means for obtaining a measurement result indicative of a dissipation in said switching element, and control means for supplying a control signal to said control terminal responsive to said measurement result to limit said dissipation, characterized in that the measurement means measure said storage time, and in that the control means compare the measured storage time to a predetermined value, and vary the control signal to obtain a substantially constant storage time.

2. A driving circuit as claimed in claim 1, characterized in that said control signal is a current in the control terminal, and the control means, responsive to said measurement result being smaller than a desired value, increases the current in the control terminal.

3. A driving circuit as claimed in claim 1, characterized in that said measurement means comprises means for counting clock pulses starting at a first instant at which the control signal has a value corresponding to switching off the switching element, until a second instant at which the measurement result indicates that the main path of the switching element has started to switch off.

4. A driving circuit as claimed in claim 1, characterized in that the control means controls a duty cycle of the control signal.

5. A method of driving a semiconductor switching element having a control terminal and a main current path, during a switch-off phase said switching element having a storage time between reversal of the control current and the start of switching off of the main current path, wherein the method comprises the steps of:

measuring to obtain a measurement result indicative of a dissipation in said switching element, and controlling to supply a control signal to said control terminal responsive to said measurement result to limit said dissipation, characterized in that the measurement means are adapted to measure said storage time, and in that the control means compare said storage time to a predetermined value, and vary the control signal to obtain a substantially constant storage time.

6. A method of driving a semiconductor switching element as claimed in claim 5, characterized in that the step of measuring comprises the step of counting clock pulses starting at a first instant related to an instant at which the control signal indicates that said switching element should switch off until a second instant related to an instant at which the measurement result indicates that said main path of said switching element starts switching off.

7. A method of driving a semiconductor switching element as claimed in claim 5, characterized in that the step of controlling adapts the control signal to increase a current in the control terminal when the measurement result indicates that a value of the storage time is smaller than the predetermined value.

8. A method of driving a semiconductor switching element as claimed in claim 5, characterized in that the step of controlling controls a duty cycle of the control signal.

9. A line deflection circuit comprising:
a series arrangement of a choke and a flyback capacitor coupled to receive a power supply voltage,
a diode and a deflection coil both coupled in parallel with the flyback capacitor,
a semiconductor switching element with a control terminal, and a main current path coupled in parallel with the diode, said switching element showing a storage time during a switch-off phase, the diode having a direction of conduction opposite to a direction of conduction of the switching element, and a driving circuit comprising:
measurement means for obtaining a measurement result indicative of a dissipation in said switching element, and
control means for supplying a control signal to said control terminal responsive to said measurement result to limit said dissipation,
characterized in that the measurement means measure said storage time, and in that the control means compare the measured storage time to a predetermined value, and vary the control signal to obtain a substantially constant storage time.

10. A line deflection circuit as claimed in claim 9, characterized in that said control signal is a current in the control terminal, and the control means, responsive to said measurement signal being smaller than a desired value, increases the current in the control terminal.

11. A line deflection circuit as claimed in claim 9, characterized in that said measurement means comprises means for counting clock pulses starting at a first instant at which the control signal has a value corresponding to switching off the switching element, until a second instant at which the measurement result indicates that the main path of the switching element has started to switch off.

12. A line deflection circuit as claimed in claim 9, characterized in that the control means controls a duty cycle of the control signal.

13. A line deflection circuit as claimed in claim 9, characterized in that the measurement means are coupled to a junction of the cathode of the diode and the choke to receive a tapped-in flyback pulse.

14. A switched mode power supply circuit comprising:
a transformer with a primary winding,
a semiconductor switching element coupled to the primary winding for periodically supplying current to the primary winding, said switching element showing a storage during a switch-off phase, and
a driving circuit comprising:
measurement means for obtaining a measurement result indicative of a dissipation in said switching element, and
control means for supplying a control signal to said control terminal responsive to said measurement result to limit said dissipation,
characterized in that the measurement means measure said storage time, and in that the control means compare the measured storage time to a predetermined value, and vary the control signal to obtain a substantially constant storage time.

15. A switched mode power supply circuit as claimed in claim 14, characterized in that said control signal is a current in the control terminal, and the control means, responsive to said measurement signal being smaller than a desired value, increases the current in the control terminal.

16. A switched mode power supply circuit as claimed in claim 14, characterized in that said measurement means comprises means for counting clock pulses starting at a first instant at which the control signal has a value corresponding to switching off the switching element, until a second instant at which the measurement result indicates that the main path of the switching element has started to switch off.

17. A switched mode power supply circuit as claimed in claim 14, characterized in that the control means controls a duty cycle of the control signal.

* * * * *